United States Patent [19]
Rincon-Mora

[11] Patent Number: 6,084,475
[45] Date of Patent: Jul. 4, 2000

[54] ACTIVE COMPENSATING CAPACITIVE MULTIPLIER

[75] Inventor: Gabriel Alfonso Rincon-Mora, Allen, Tex.

[73] Assignee: Texas Instruments Incorporated, Dallas, Tex.

[21] Appl. No.: 09/167,506

[22] Filed: Oct. 6, 1998

[51] Int. Cl.[7] ...................................................... H03F 3/45
[52] U.S. Cl. ........................................... 330/255; 330/292
[58] Field of Search ................................... 330/255, 292, 330/293; 327/356, 359, 53, 66, 391, 112, 437

[56] References Cited

U.S. PATENT DOCUMENTS

| | | | |
|---|---|---|---|
| 4,267,519 | 5/1981 | Schade, Jr. ............................... | 330/255 |
| 4,709,159 | 11/1987 | Pace . | |
| 5,079,514 | 1/1992 | Mijuskovic ............................. | 330/253 |
| 5,140,281 | 8/1992 | Fujisawa et al. ....................... | 330/261 |
| 5,274,284 | 12/1993 | Krenik et al. . | |
| 5,485,121 | 1/1996 | Huijsing et al. ........................ | 330/260 |
| 5,541,555 | 7/1996 | Pernici .................................... | 330/253 |
| 5,754,078 | 5/1998 | Tamagawa .............................. | 330/255 |
| 5,798,673 | 8/1998 | Griffith et al. .......................... | 330/255 |
| 5,847,607 | 12/1998 | Lewicki et al. ......................... | 330/258 |

OTHER PUBLICATIONS

Paul R. Gray and Robert G. Meyer, *Analysis and Design of Analog Integrated Circuits–Third Edition,* pp. 607–623, 1993.

*Primary Examiner*—Robert Pascal
*Assistant Examiner*—Henry Choe
*Attorney, Agent, or Firm*—J. Dennis Moore; Wade James Brady, III; Richard L. Donaldson

[57] ABSTRACT

A compensated amplifier, for amplifying an input signal applied to an input node to provide an output signal at an amplifier output node. The compensated amplifier includes a first amplifier stage having an internal node as an input thereto and having a first stage output node. Also included is a second amplifier stage coupled to the first amplifier stage, having the input node as an input thereto and providing the output signal at the amplifier output node. A capacitor is coupled between the output node and the internal node.

5 Claims, 4 Drawing Sheets

ACTIVE COMPENSATING CAPACITIVE MULTIPLIER

TECHNICAL FIELD OF THE INVENTION

This invention relates to frequency compensation of electronic circuits, and more particularly relates to circuits having compensating capacitors, such as Miller Effect capacitors.

BACKGROUND OF THE INVENTION

The stability performance of circuits having feedback is improved by providing compensation so as to increase phase margin. A well known technique for improving phase margin takes advantage of the Miller Effect, by adding a Miller-compensating capacitance in parallel with a gain stage, e.g., the output stage of a two stage amplifier circuit. Such a configuration results in the well-known and desirable phenomenon called pole splitting, which advantageously multiplies the effective capacitance of the physical capacitor employed in the circuit. See, e.g., for background on compensation of amplifier circuits using Miller-compensating capacitance, Paul R. Gray and Robert G. Meyer, *Analysis and Design of Analog Integrated Circuits*, Third Ed., John Wiley & Sons, Inc., New York, 1993, Ch. 9, especially pp. 607–623.

A problem arises when the load capacitance seen by a circuit having compensating capacitance such as Miller-compensating capacitance becomes large. This requires the compensating capacitance to increase in value in order to maintain stability. However, the larger compensating capacitance occupies more physical space. But, this is not a luxury that can be afforded in an environment where more circuits are integrated onto the same die, which, of course, is the trend.

There is thus a need for a way of dealing with larger load capacitance seen by amplifier circuits having compensating capacitance such as Miller-compensating capacitance, without placing increasing demands on die area for the circuit. There is also a need to optimize and reduce the silicon area requirement of existing circuit designs using such capacitors, to allow greater chip packing densities, and thus single integrated chip solutions.

SUMMARY OF THE INVENTION

The present invention provides an improved compensated amplifier, for amplifying an input signal applied to an input node to provide an output signal at an amplifier output node. The compensated amplifier includes a first amplifier stage having an internal node functioning as an input thereto and having a first stage output node. Also included is a second amplifier stage coupled to the first amplifier stage, having the input node as an input thereto and providing the output signal at the amplifier output node. A capacitor is coupled between the output node and the internal node.

The invention may be advantageously applied for the purpose of multiplying Miller-compensating capacitance, although it is not limited to that application.

It is to be understood that the term "amplifier" as used herein is not limited to any specific form of amplifier, such as an operational amplifier. Rather, the term is intended to refer to any circuit that provides an amplified form of an input signal applied thereto.

These and other features of the invention will be apparent to those skilled in the art from the following detailed description of the invention, taken together with the accompanying drawings.

DETAILED DESCRIPTION OF THE PREFERRED EMBODIMENT

Figure 1:
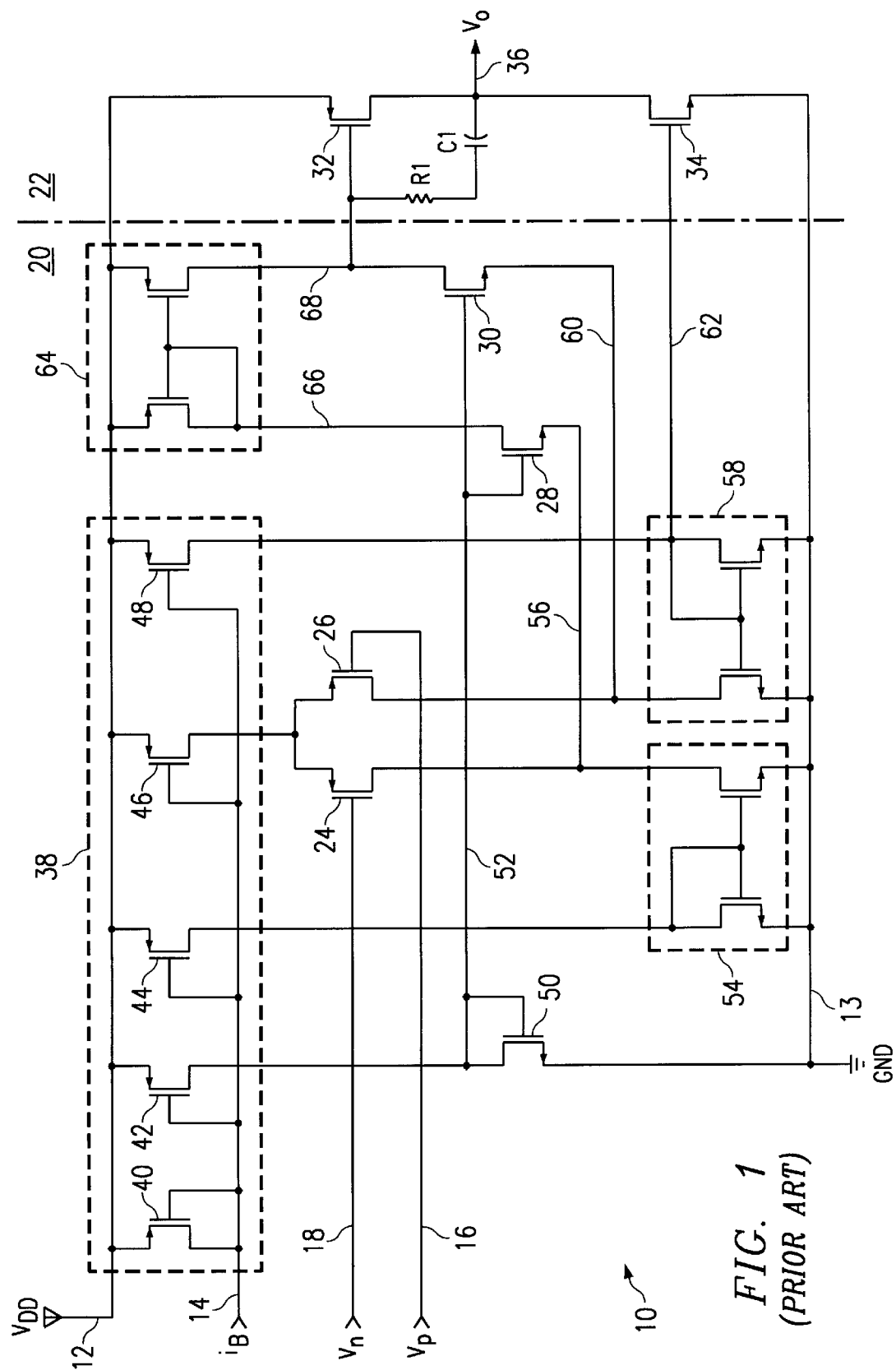
FIG. 1 is a schematic diagram of a prior art differential amplifier including a Miller-compensating capacitor.

FIG. 1 is a schematic diagram of a prior art differential amplifier 10 including a Miller-compensating capacitor C1. A supply voltage $V_{DD}$ is provided between a supply rail 12 and a ground rail 13. A sinking bias current $i_B$ is provided on an input line 14. A differential input is provided, with the positive going signal $V_p$ being provided on input line 16 and the negative going signal $V_n$ being provided on input line 18. The amplifier 10 structure is two stage. The first stage 20 is a folded-cascode differential amplifier. The second stage 22 is a Miller-compensated PMOS device amplifier.

In the first stage 20, the differential inputs on lines 16 and 18 are provided to the respective gates of a pair of PMOS devices 24, 26. The differential current generated through devices 24, 26, is reflected into NMOS devices 28, 30. The voltage on the drain of device 30 is sensed at the gate of output PMOS device 32. Capacitor C1 and resistor R1, series connected between the drain and gate of device 32, provide Miller compensation for amplifier 10.

The other circuitry of amplifier 10 is provided for the various biases required by amplifier 10. Thus, NMOS device 34 provides a quiescent bias current for output PMOS transistor 32. PMOS device structure 38 is a multiple output current mirror. Device 40 is diode-connected and establishes a stable internal bias voltage, based on the input bias current $i_B$ on line 14. This stable bias current $i_B$ is thus mirrored by devices 42, 44, 46, and 48. The mirrored current in device 42 is converted into another stable bias voltage by NMOS device 50 at node 52, which biases the gates of devices 28, 30. The mirrored current in device 44 is also mirrored by NMOS current mirror 54 to force current generation via node 56 through device 28 and device 24. Likewise, the mirrored current in device 48 is also mirrored by NMOS current mirror 58 to force current generation via node 60 through device 30 and device 26. The mirrored current in device 46 provides a stable bias current for devices 24 and 26. Finally, the current mirror 64 provides an ac path and a stable current supply, via lines 66 and 68, to devices 28 and 30, respectively.

Figure 2:
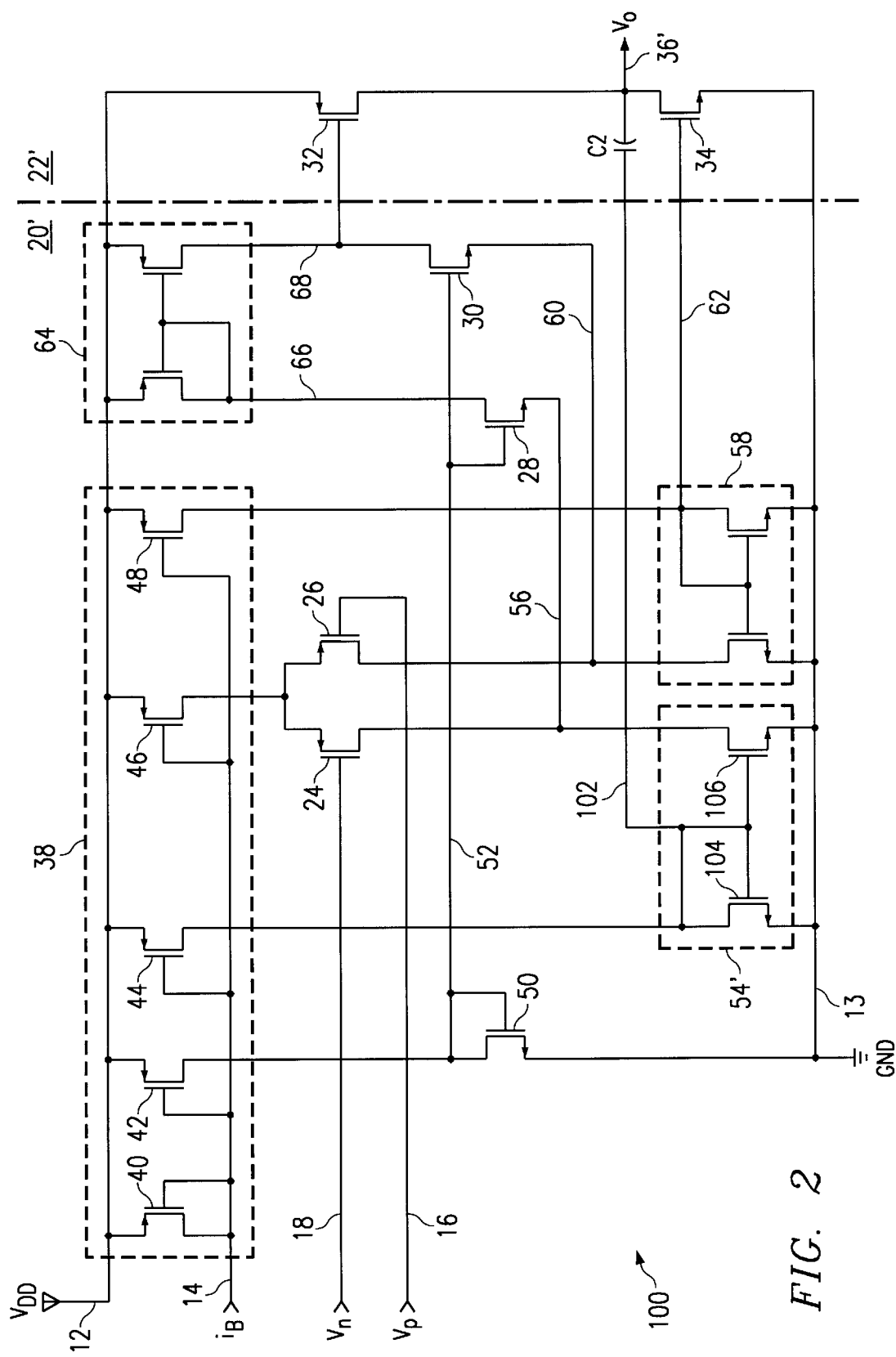
FIG. 2 is a schematic diagram of a differential amplifier including a Miller-compensating capacitor provided in accordance with the principles of the present invention.

The circuit 10 described above in FIG. 1 is known, and provides good performance. In fact, the use of a Miller-compensating capacitor results in a multiplication of the effective compensating capacitance, enhancing the desirable, and known, effect of pole splitting. However, as the load capacitance on output node 36 increases, the Miller-compensating capacitor C1 must also increase in value to maintain stability in the circuit 10. This can result in capacitor C1 occupying more physical space than is desired, or even than can be afforded. FIG. 2 is a schematic diagram of a differential amplifier 100 including a Miller-compensating capacitor C2 provided in accordance with the principles of the present invention. Similar to the circuit 10 of FIG. 1, the amplifier 100 structure is two stage, the first stage 20' being a folded-cascode differential amplifier, and the second stage 22' being a Miller-compensated PMOS device amplifier. Unlike the circuit 10 of FIG. 1, however, Miller-compensating capacitor C1 and resistor R1 are not provided.

Instead, the circuit 100 of FIG. 2 includes a novel capacitor arrangement consisting of capacitor C2 connected between the output node 36' and the common connection node 102 for the gates of the two NMOS devices—an NMOS device 104 diode-connected, and an NMOS device 106 ratioed by a factor of ten as compared with device 104, comprising current mirror 54'. By connecting capacitor C2 in this way, the feedback current flowing through capacitor C2 is amplified, i.e. multiplied by, e.g., ten by current mirror 54' before reaching the high impedance node 68. The resulting load capacitance seen by the high-impedance node 68 is then ten times greater than the Miller-multiplied version connected using prior art principles. Thus, there is provided by the present invention a multiplication of an effective capacitance that is itself a multiplied, effective capacitance.

Note that the value ten for the multiplication factor described above is arbitrary, and is selected for example only. The gain, and thus the multiplication factor, is ultimately achieved in the circuit of FIG. 2 by the effective current amplification by current mirror 54', and its limitation depends on the physical restrictions, or spread, of current mirror 54'. In the circuit of FIG. 2 the mirror ratio of the current flowing through current mirror 54', i.e., the ratio of the widths of device 106 and device 104, and thus the ratio of the current flowing through device 106 as compared with device 104, is ten. Other ratios, and thus other capacitance multiplication factors are possible. The width of PMOS device 44 is reduced by the same ratio. For optimal matching performance (low input offset), PMOS device 48 and current mirror 58 are made to match PMOS device 44 and current mirror 54. Key is the amplification of the compensating capacitor's current.

Figure 3:
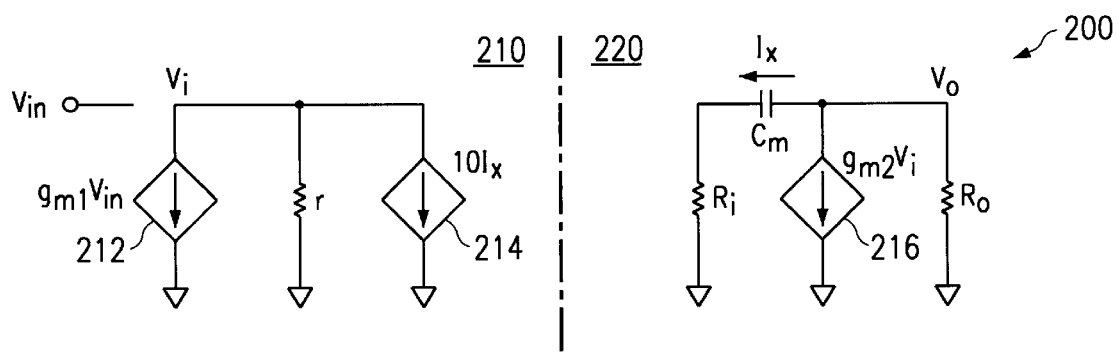
FIG. 3 is a diagram showing an ac-equivalent circuit model of the amplifier circuit of FIG. 2.

FIG. 3 shows an ac-equivalent model 200 of the amplifier circuit of FIG. 2. The model 200 has two stages, a first stage 210 and a second stage 220. As shown, in first stage 210 a differential input voltage $V_{in}$ ($V_{in}=V_p-V_n$) produces a current of $g_{m1}V_{in}$ in equivalent transconductor 212. In the second stage 220, a voltage $V_x$ is seen at the input of Miller-compensating capacitance $C_m$ and an ac current $I_x$ flows through internal resistance $R_i$. The current $I_x$ is reflected back through block 214, multiplied by ten, to the input circuit 210.

The transfer function of the circuit model 200 of FIG. 3 may be derived as follows:

$$I_x=(V_o-V_x)C_m s \qquad \text{Eq. 1}$$

$$V_x V_o R_i C_m s/1+R_i C_m s \qquad \text{Eq. 2}$$

$$V_o=-\{[V_{in}g_{m1}+10I_x]rg_{m2}+I_x\}R_o \qquad \text{Eq. 3}$$

Combining Equations 1, 2 and 3 yields:

$$\frac{V_o}{V_i} \cong \frac{-(g_{m1}rg_{m2}R_o)(1+R_iC_m s)}{1+C_m s(R_i+10rg_{m2}R_o)} \approx \frac{-g_{m1}rg_{m2}R_o(1+R_iC_m s)}{1+C_m s 10 rg_{m2}R_o} \qquad \text{Eq. 4}$$

Note in Equation 4 that there is no right-hand plane zero. In fact, a Left Hand Plane (LHP) zero is inserted. This LHP zero can be used to optimize the compensation of the loop in FIG. 2 created by the connection of capacitor C2 between the output node 36' in the second stage 22' and the common gate connection of devices 104 and 106 in the first stage 20', which is controlled by the transconductance of device 104. The dominant pole for the circuit 100 of FIG. 2 is defined by the high impedance node 68 and ten times the gain of the second stage 22' times the Miller-compensating capacitance C2. For instance, the LHP zero can be to designed to lie approximately where the pole of output node 36' lies. As a result, the pole is cancelled and phase margin is consequently increased.

Figure 4:
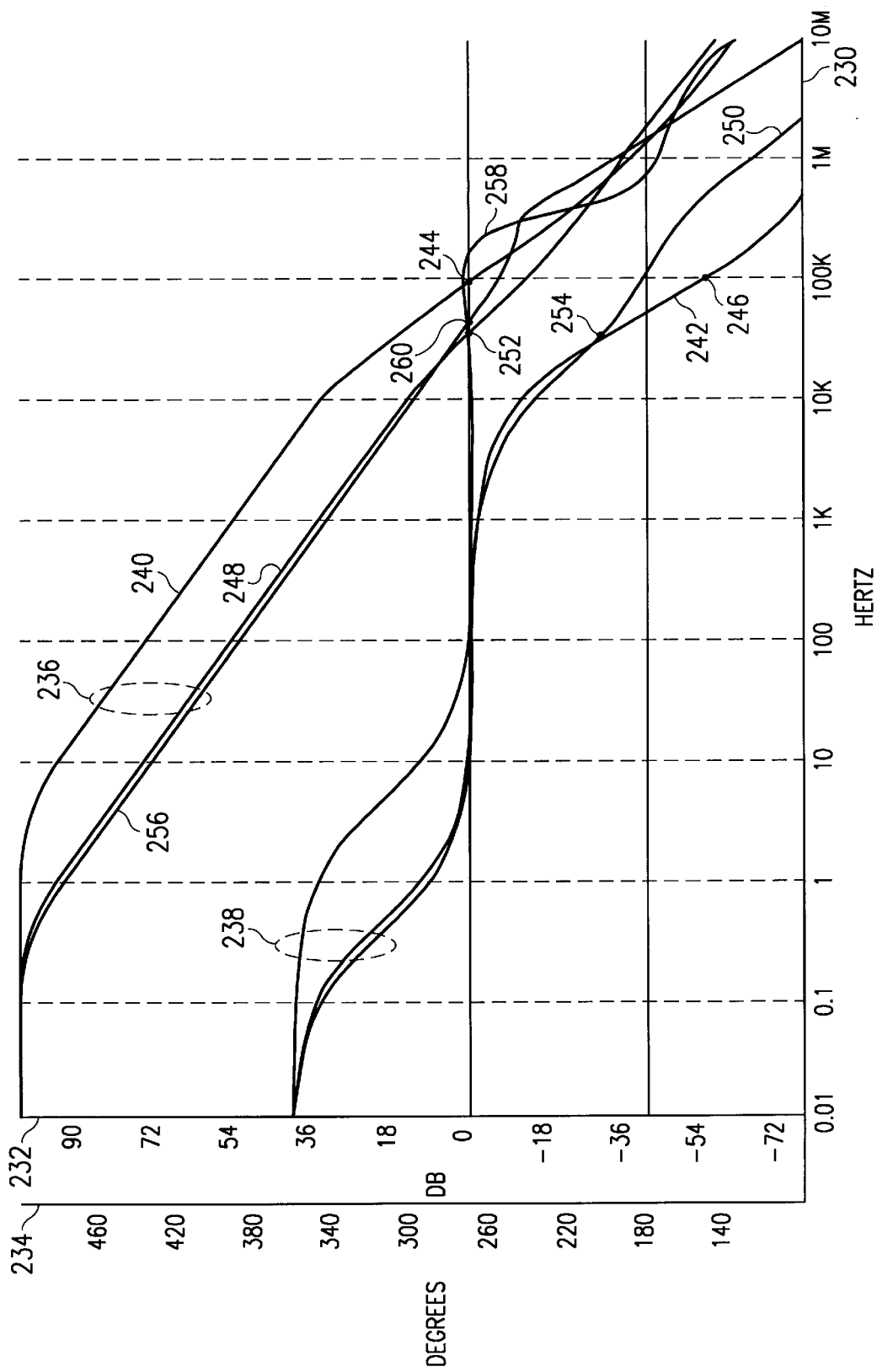
FIG. 4 is a graph comparing Bode plots of the behavior of circuits like that in FIG. 1 and that in FIG. 2.

FIG. 4 is a graph showing Bode plots of the behavior of different circuits like the circuit shown in FIG. 1 and the circuit shown in FIG. 2. This figure helps in understanding the principles presented in the immediately preceding paragraph. Two different sets of curves 236, 238, are shown in FIG. 4. As can be seen, while there is one horizontal axis 230, representing frequency and divided into units of Hertz, there are two vertical axes, a first axis 232, representing the gain of the respective circuit and divided into units of decibels ("DB"), and a second axis 234, representing the relative phase of the output signal as compared with the phase of the input signal, and divided into units of degrees. The first set of curves 236 is plotted against the gain axis 232, while the second set of curves 238 is plotted against the phase shift axis 234. In the set of curves 238 a zero relative phase compared with the input is 0°, which is the same as 360°. In all of the circuits represented in FIG. 4, as frequency increases the phase of the output signal tends to lag more, as compared with the phase of the input signal, and thus it will be noted that the curves 238 all tend to drop, showing a decrease in phase from 360° as frequency increases. In addition, in all of the circuits represented in FIG. 4, as frequency increases the gain tends to drop, and thus it will be noted that the curves 236 all tend to drop, showing a decrease in gain as frequency increases.

A first curve 240 is a plot of the gain of a representative circuit constructed like that of FIG. 1, against frequency, in which the compensating-capacitance C1 is 2 pF. A second curve 242 is a plot of the relative phase of the output signal $V_o$ as compared with the phase of the input signal $V_{in}=V_p-V_n$ for the same circuit. Note that at the frequency at which the unity gain point 244 exists for curve 240 the relative phase, shown by point 246, is approximately 140°, which represents a phase shift of −220°, or 40° more than the −180° limit for stable operation.

A third curve 248 is a plot of the gain of a representative circuit constructed like that of FIG. 1, against frequency, in which the compensating-capacitance C1 is 20 pF. A fourth curve 250 is a plot of the relative phase of the output signal $V_o$ as compared with the phase of the input signal $V_{in}$ for the same circuit. Note that at the frequency at which the unity gain point 252 exists for curve 248 the relative phase, shown by point 254, is approximately 200°, which is a phase shift of only −160°, which is within the −180° limit for stable operation.

Now, a fifth curve 256 is a plot of the gain of a representative circuit constructed like that of FIG. 2, against frequency, in which the compensating-capacitance C2 is 2 pF. A sixth curve 258 is a plot of the relative phase of the output signal $V_o$ as compared with the phase of the input signal $V_{in}$ for the same circuit. Note that at the frequency at which the unity gain point 260 exists for curve 256 the relative phase, coincidentally also shown by point 260, is approximately 270°, which is a phase shift of only −90°, which is well within the −180° limit for stable operation. In fact, stable operation continues well beyond the unity gain frequency. Thus, the extension of curve 258 in the manner shown so as to increase the phase margin shows how the LHP zero can be placed strategically so as to enhance the stability of the circuit of FIG. 2.

Figure 5:
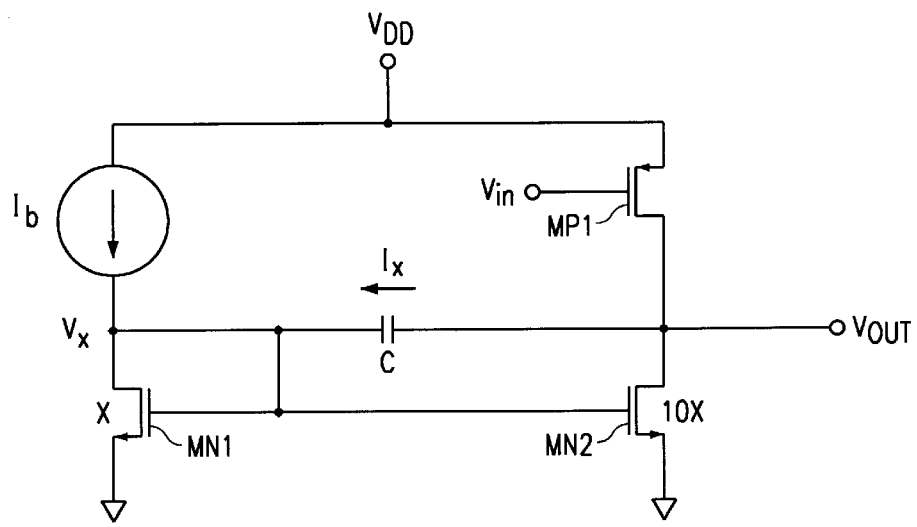
FIG. 5 is a schematic diagram of a simple amplifier including a compensating capacitor provided in accordance with the principles of the present invention.
Figure 6:
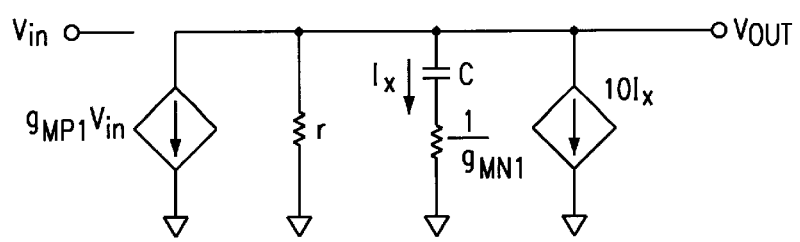
FIG. 6 is a diagram showing an ac-equivalent circuit model of the amplifier circuit of FIG. 5.

The technique may also be extended to simple compensated amplifiers that do not have Miller-compensating capacitance. FIG. 5 illustrates one such implementation. In this instance, the technique is used to effectively multiply the compensating capacitor C. NMOS device MN2 is ten times larger than NMOS device MN1, providing a multiplication factor of eleven; current $I_x$ is sensed by MN1 and multiplied by ten by MN2. Thus, the effective capacitive current is $I_x+10I_x$, hence the multiplication factor of eleven, again a factor chosen arbitrarily. A LHP zero is also inserted in this embodiment. The resulting transfer function, illustrated by the ac-equivalent circuit model shown in FIG. 6, is roughly:

$$\frac{V_{out}}{V_{in}} \approx \frac{-g_{mp1}(r_{\delta s-MP1} \text{ // } r_{\delta s-MN2})\left(1 + \frac{C_S}{g_{MN2-MN1}}\right)}{1 + s(11C)(r_{\delta s} \text{ // } r_{\delta s-MN1})} \qquad \text{Eq. 5}$$

where Equations 1 and 2 still apply. Note that in FIG. 6

$r_{\delta s} = r_{\delta sMN2} // r_{\delta sMP1}$.

Finally, note that while the circuits disclosed herein are all made of MOS devices, the principles are applicable as well to circuits made of bipolar devices. For example, a bipolar current mirror could be used as a current amplifier in much the same way as the NMOS current mirror 54' of FIG. 2, to provide the effective multiplication of capacitance.

Although the present invention and its advantages have been described in detail, as well as some variations over the disclosed embodiments, it should be understood that various other changes, substitutions and alterations can be made herein without departing from the spirit and scope of the invention as defined by the appended claims.

What is claimed is:

1. A Miller-compensated amplifier, for amplifying an input signal applied to an amplifier input node to provide an output signal at an amplifier output node, comprising:

a first amplifier stage having an internal node as an input thereto, and having a first stage output node;

a second amplifier stage having said amplifier input node as an input thereto, and having a second stage output node;

a third amplifier stage having a third stage input node coupled to said first stage output node and to said second stage output node, and providing said output signal at said amplifier output node; and a capacitor coupled between said amplifier output node and said internal node so as to provide voltage-mode gain.

2. A Miller-compensated amplifier according to claim 1, wherein said capacitor is connected such that a left-hand-plane zero is provided in said compensated amplifier.

3. A compensated amplifier according to claim 2, wherein said left-hand-plane zero is selected so as to optimize compensation for said compensated amplifier.

4. A compensated amplifier according to claim 1, wherein said first amplifier stage comprises a diode connected transistor and a ratioed transistor connected together forming a current mirror, and wherein said diode connected transistor senses said capacitive current at said internal node and said ratioed transistor amplifies said capacitive current.

5. A Miller-compensated amplifier, for amplifying a differential input signal applied to an amplifier input node to provide an output signal at an amplifier output node, comprising:

a differential amplifier, for converting the voltage of said differential input signal to differential input currents;

a bias voltage source;

a first FET and a second FET;

first and second current mirrors each mirroring one of said differential input currents to one of said first and said second FETs, said first current mirror comprising a third FET and a fourth FET having a common gate connection node, and said second current mirror comprising a fifth FET and a sixth FET having a common gate connection node;

a third current mirror providing current to said first FET and to said second FET;

a seventh FET sensing, at a gate thereof, a voltage on one of said first FET and said second FET, and having a source thereof connected to a voltage source;

a current source providing a current to a drain of said seventh FET; and a capacitor having one plate connected to the common connection node for said current source and said seventh FET, and having another plate connected to the common gate connection node of one of said first current mirror and said second current mirror.

* * * * *

(12) EX PARTE REEXAMINATION CERTIFICATE (7167th)
United States Patent
Rincon-Mora

(10) Number: US 6,084,475 C1
(45) Certificate Issued: Nov. 17, 2009

(54) ACTIVE COMPENSATING CAPACITIVE MULTIPLIER

(75) Inventor: Gabriel Alfonso Rincon-Mora, Allen, TX (US)

(73) Assignee: Texas Instruments Incorporated, Dallas, TX (US)

Reexamination Request:
No. 90/010,295, Sep. 26, 2008

Reexamination Certificate for:
Patent No.: 6,084,475
Issued: Jul. 4, 2000
Appl. No.: 09/167,506
Filed: Oct. 6, 1998

(51) Int. Cl.
*H03F 1/08* (2006.01)

(52) U.S. Cl. .................. 330/255; 330/292; 330/293; 327/356; 327/359; 327/53; 327/66; 327/391; 327/112; 327/437

(58) Field of Classification Search .................. None
See application file for complete search history.

(56) References Cited

U.S. PATENT DOCUMENTS 5,818,295 A    10/1998   Chimura et al. ............. 327/561

OTHER PUBLICATIONS

Pernici et al., "A CMOS Low–Distortion Fully Differential Power Amplifier with Double Nested Miller Compensation", IEEE JSSC, vol. 28, No. 7, Jul. 1993, pp. 758–763, USA. (Figure 4 and Table 1).
Callewaert et al., "Class AB CMOS Amplifiers with High Efficiency", IEEE JSSC, vol. 25, No. 3, Jun. 1990, pp. 684–691, USA. (Figure 11 and Table 1).

*Primary Examiner*—Linh M. Nguyen

(57) ABSTRACT

A compensated amplifier, for amplifying an input signal applied to an input node to provide an output signal at an amplifier output node. The compensated amplifier includes a first amplifier stage having an internal node as an input thereto and having a first stage output node. Also included is a second amplifier stage coupled to the first amplifier stage, having the input node as an input thereto and providing the output signal at the amplifier output node. A capacitor is coupled between the output node and the internal node.

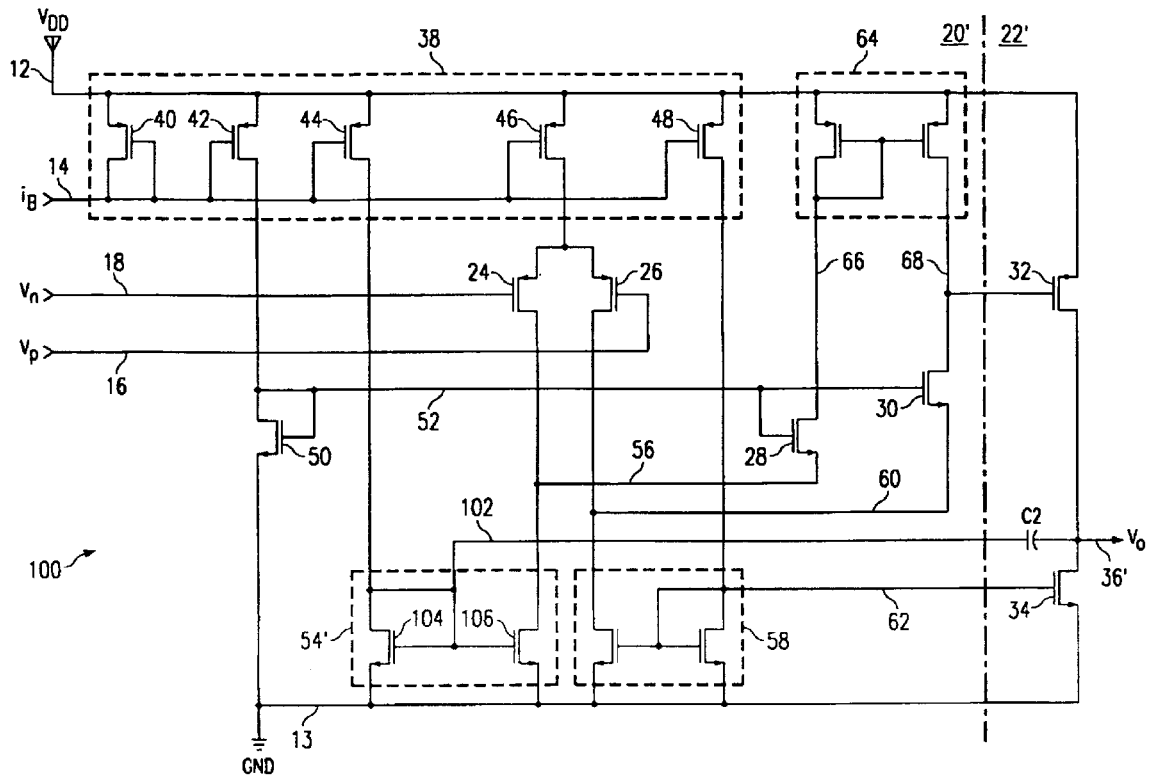

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 5 is cancelled.

Claim 1 is determined to be patentable as amended.

Claim 4, dependent on an amended claim, is determined to be patentable.

New claims 6–21 are added and determined to be patentable.

Claims 2–3 were not reexamined.

1. A Miller-compensated amplifier, for amplifying an input signal applied to an amplifier input node to provide an output signal at an amplifier output node, comprising:
   a first amplifier stage having an internal node as an input thereto, and having a first stage output node, *said first amplifier stage comprising a diode connected transistor*;
   a second amplifier stage having said amplifier input node as an input thereto, and having a second stage output node;
   a third amplifier stage having a third stage input node coupled to said first stage output node and to said second stage output node, and providing said output signal at said amplifier output node; and
   a capacitor coupled between said amplifier output node and said internal node so as to provide voltage-mode gain, *said capacitor directly connecting with said diode connected transistor*.

*6. A Miller-compensated amplifier according to claim 1, said first amplifier stage has a gain greater than one.*

*7. A Miller-compensated amplifier according to claim 1, said second stage output node is a different node than said internal node.*

*8. A Miller-compensated amplifier according to claim 1, said second amplifier stage comprising a differential amplifier.*

*9. A Miller-compensated amplifier according to claim 1, said third amplifier stage comprising at least an nMOS transistor and at least a pMOS transistor.*

*10. A Miller-compensated amplifier according to claim 4, said first amplifier stage has a gain greater than one.*

*11. A Miller-compensated amplifier according to claim 4, said second stage output node is a different node than said internal code.*

*12. A Miller-compensated amplifier, for amplifying an input signal applied to an amplifier input node to provide an output signal at an amplifier output node, comprising:*
   *a first amplifier stage having an internal node as an input thereto, and having a first stage output node;*
   *a second amplifier stage having said amplifier input node as an input thereto, and having a second stage output node;*
   *a third amplifier stage having a third stage input node coupled to said first stage output node and to said second stage output node, and providing said output signal at said amplifier output node; and*
   *a capacitor coupled between said amplifier output node and said internal node so as to provide voltage-mode gain, operative coupling from said second stage output node to said internal node of said first amplifier stage is only accomplished through said third amplifier stage.*

*13. A Miller-compensated amplifier according to claim 12, wherein said capacitor is connected such that a left-hand-plane zero is provided in said compensated amplifier.*

*14. A Miller-compensated amplifier according to claim 12, said first amplifier stage has a gain greater than one.*

*15. A Miller-compensated amplifier according to claim 12, said first amplifier stage comprising a diode connected transistor.*

*16. A Miller-compensated amplifier according to claim 12, said second amplifier stage comprising a differential amplifier.*

*17. A Miller-compensated amplifier according to claim 12, said third amplifier stage comprising at least an nMOS transistor and at least a pMOS transistor.*

*18. A Miller-compensated amplifier according to claim 12, wherein said first amplifier stage comprises a diode connected transistor and a ratioed transistor connected together forming a current mirror, and wherein said diode connected transistor senses said capacitive current at said internal node and said ratioed transistor amplifies said capacitive current.*

*19. A Miller-compensated amplifier according to claim 18, said first amplifier stage has a gain greater than one.*

*20. A Miller-compensated amplifier according to claim 18, said second amplifier stage comprising a differential amplifier.*

*21. A Miller-compensated amplifier according to claim 18, said third amplifier stage comprising at least an nMOS transistor and at least a pMOS transistor.*

* * * * *